(12) United States Patent
Ishihara

(10) Patent No.: US 8,988,077 B2
(45) Date of Patent: Mar. 24, 2015

(54) BATTERY CONDITION DETECTION SENSOR

(75) Inventor: Hideaki Ishihara, Shiga (JP)

(73) Assignee: Furukawa Electric Co., Ltd. (JP)

( * ) Notice: Subject to any disclaimer, the term of this patent is extended or adjusted under 35 U.S.C. 154(b) by 399 days.

(21) Appl. No.: 13/387,735

(22) PCT Filed: Mar. 28, 2011

(86) PCT No.: PCT/JP2011/001834
§ 371 (c)(1),
(2), (4) Date: Jan. 28, 2012

(87) PCT Pub. No.: WO2011/121981
PCT Pub. Date: Oct. 6, 2011

(65) Prior Publication Data
US 2012/0126818 A1 May 24, 2012

(30) Foreign Application Priority Data
Mar. 30, 2010 (JP) ................. 2010-078513

(51) Int. Cl.
G01N 27/416 (2006.01)
H01M 2/30 (2006.01)
G01R 31/36 (2006.01)
H01M 10/42 (2006.01)
(Continued)

(52) U.S. Cl.
CPC ............. *H01M 2/30* (2013.01); *G01R 31/3696* (2013.01); *H01M 10/425* (2013.01); *H01R 11/287* (2013.01); *G01R 1/203* (2013.01); *H01R 13/6683* (2013.01); *H01R 2201/26* (2013.01)
USPC ........................................ 324/426

(58) Field of Classification Search
CPC ................................... G01R 31/3648
USPC .......................................... 324/426
See application file for complete search history.

(56) References Cited

U.S. PATENT DOCUMENTS 5,372,898 A * 12/1994 Atwater et al. ............. 429/90
5,412,323 A * 5/1995 Kato et al. .................. 324/429
(Continued)

FOREIGN PATENT DOCUMENTS

DE 202008017318 6/2009
EP 1204165 5/2002
(Continued)

OTHER PUBLICATIONS

International Search Report for Application No. PCT/JP2011/001834 dated Oct. 6, 2011, 4 pages.
(Continued)

*Primary Examiner* — Yalkew Fantu
(74) *Attorney, Agent, or Firm* — Amin, Turocy & Watson, LLP

(57) ABSTRACT

A battery condition detection sensor (1) for measuring characteristics of a battery (101) includes an electrically conductive battery post terminal (12) and a shunt resistor (13). The battery post terminal (12) is mounted to a battery post (102) provided in the battery (101). The shunt resistor (13) is electrically connected to the battery post terminal (12). The shunt resistor (13) is configured such that a connection terminal (52) of a wire harness (51) can be fixed thereto. The shunt resistor (13) has a rotation-blocking portion (inner walls of the insertion holes (15a, 15b)) for blocking rotation of the connection terminal (52).

4 Claims, 3 Drawing Sheets

(51) Int. Cl.
    *H01R 11/28*   (2006.01)
    *G01R 1/20*   (2006.01)
    *H01R 13/66*   (2006.01)

(56) References Cited

U.S. PATENT DOCUMENTS

| | | | | |
|---|---|---|---|---|
| 5,721,688 | A * | 2/1998 | Bramwell | 702/63 |
| 6,211,653 | B1 * | 4/2001 | Stasko | 320/149 |
| 7,375,497 | B2 * | 5/2008 | Melichar | 320/132 |
| 7,500,888 | B2 * | 3/2009 | Roset et al. | 439/754 |
| 2008/0194152 | A1 | 8/2008 | Roset | |
| 2009/0212781 | A1 * | 8/2009 | Bertness et al. | 324/426 |

FOREIGN PATENT DOCUMENTS

| | | | |
|---|---|---|---|
| JP | 2001-325940 | | 11/2001 |
| JP | 2002-313312 | | 10/2002 |
| JP | 2005-129379 | | 5/2005 |
| JP | 2006-040796 | | 2/2006 |
| JP | 2006-085945 | * | 3/2006 |
| JP | 2009-146574 | | 7/2009 |

OTHER PUBLICATIONS

European Search Report for European Application No. 11762229.0-1360/2485299 PCT/JP2011001834 dated Oct. 7, 2014, 5 pages.

* cited by examiner

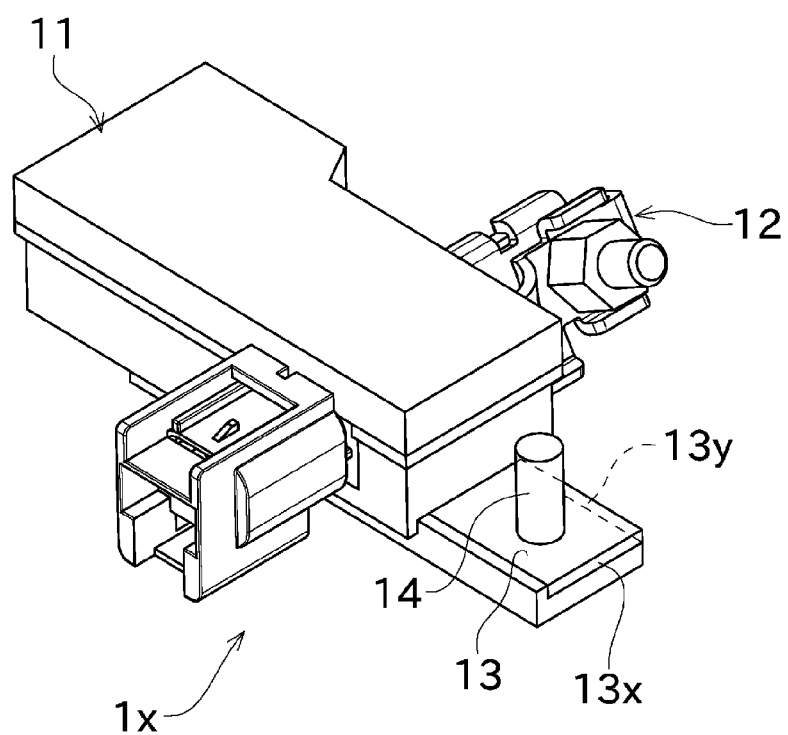

BATTERY CONDITION DETECTION SENSOR

TECHNICAL FIELD

The present invention relates to a battery condition detection sensor for detecting characteristics of a battery.

BACKGROUND ART

Conventionally, a battery condition detection sensor is mounted to a battery post provided in a battery, to measure characteristics and a condition (such as a voltage, a current, a temperature, and an internal resistance) of the battery. Patent Documents 1 and 2 disclose battery condition detection sensors of this type.

The Patent Document 1 discloses a configuration in which a coupling member made of an electrically conductive material is formed integrally with a current sensor. One end of the coupling member is coupled and fixed to a battery terminal that is connected to the battery post, and the other end thereof is coupled and fixed to a connection terminal of a harness. The harness and the coupling member are fixed to each other with a bolt.

In a terminal adapter disclosed in the Patent Document 2, an extension portion separate from a shunt resistor is formed. The extension portion includes a clamp portion having a pair of fingers, to thereby prevent rotation of the wire harness.

Patent Document 1: Japanese Patent Application Laid-Open No. 2006-85945

Patent Document 2: U.S. Pat. No. 7,500,888

DISCLOSURE OF THE INVENTION

Problems to be Solved by the Invention

However, in the configuration of the Patent Document 1 mentioned above, the harness may sometimes rotate relative to the coupling member during an assembling work for connecting the harness to the coupling member, and therefore a working efficiency is not good. Additionally, in a case where the configuration of the Patent Document 1 is applied to a vehicle battery, vibrations occurring while a vehicle is traveling cause the harness to rotate relative to the coupling member, which may consequently loosen the mounting. Thus, there is still room for improvement in terms of the reliability.

In this respect, in the Patent Document 2, a configuration for fixing the harness against rotation is provided, and therefore the above-described problem could be solved to some extent. However, since a special component part therefor is required, the size of a component part or the number of component parts increases, which increases the size of a battery condition detection sensor. As a result, it is likely that the battery condition detection sensor largely protrudes beyond the battery when the battery condition detection sensor is mounted on the battery, which may deteriorate the degree of freedom in layout design.

The present invention has been accomplished under such circumstances, and an object of the present invention is to provide a battery condition detection sensor having a compact and simple configuration capable of blocking rotation of a wire harness mounted thereon.

Means for Solving the Problems and Effects Thereof

Problems to be solved by the invention are as described above, and next, means for solving the problems and effects thereof will be described.

In an aspect of the present invention, the following configuration in a battery condition detection sensor for measuring characteristics of a battery is provided. The battery condition detection sensor includes a battery post terminal and a shunt resistor. The battery post terminal is electrically conductive, and can be mounted to a battery post provided in the battery. The shunt resistor is electrically connected to the battery post terminal. The shunt resistor is configured such that a connection terminal fixed to a wire harness can be fixed thereto. The shunt resistor has a rotation-blocking portion for blocking rotation of the connection terminal.

Accordingly, a function for blocking rotation of the wire harness is exhibited by the shunt resistor itself. Therefore, blocking of rotation of the wire harness can be achieved with a compact and simple configuration, and a working efficiency in assembling and the reliability of connection can be improved.

The above-described battery condition detection sensor is preferably configured as follows. At least one insertion recess is formed in the shunt resistor. A protrusion provided at the connection terminal is inserted in the insertion recess, thereby blocking rotation of the connection terminal.

Accordingly, rotation of the wire harness can be surely blocked with an uncomplicated configuration of a combination of the protrusion and the recess.

In the above-described battery condition detection sensor, it is preferable that more than one insertion recesses are formed, and an orientation of the wire harness can be changed by selecting which of the insertion recesses a protrusion provided at the connection terminal is to be inserted in.

This can provide a battery condition detection sensor that is flexibly compatible with a layout of peripheral devices.

In the above-described battery condition detection sensor, it is preferable that the shunt resistor has a wide portion, and the insertion recess is arranged in the wide portion.

This makes it easy to ensure a space for forming the insertion recess in the shunt resistor.

The above-described battery condition detection sensor may be configured such that the protrusion provided at the connection terminal is brought into contact with an outer edge portion of the shunt resistor, thereby blocking rotation of the connection terminal.

Accordingly, blocking of rotation of the wire harness can be achieved with a compact and simple configuration.

In the above-described battery condition detection sensor, it is preferable that an orientation of the wire harness can be changed by selecting a position where the protrusion of the connection terminal is brought into contact with the outer edge portion of the shunt resistor.

This can provide a battery condition detection sensor that is flexibly compatible with a layout of peripheral devices.

In the above-described battery condition detection sensor, it is preferable that a stud for fixing the connection terminal is fixed to the shunt resistor by press-fitting.

This enables the wire harness to be connected to the battery condition detection sensor with a simple and low-cost configuration. Additionally, since rotation of the connection terminal around the stud can be blocked by the rotation-blocking portion, a good working efficiency in assembling is obtained, and loosening of screwing due to vibrations can be surely prevented.

BRIEF DESCRIPTION OF THE DRAWINGS

FIG. 3 is a perspective view showing a battery condition detection sensor according to a second embodiment.

Figure 1:
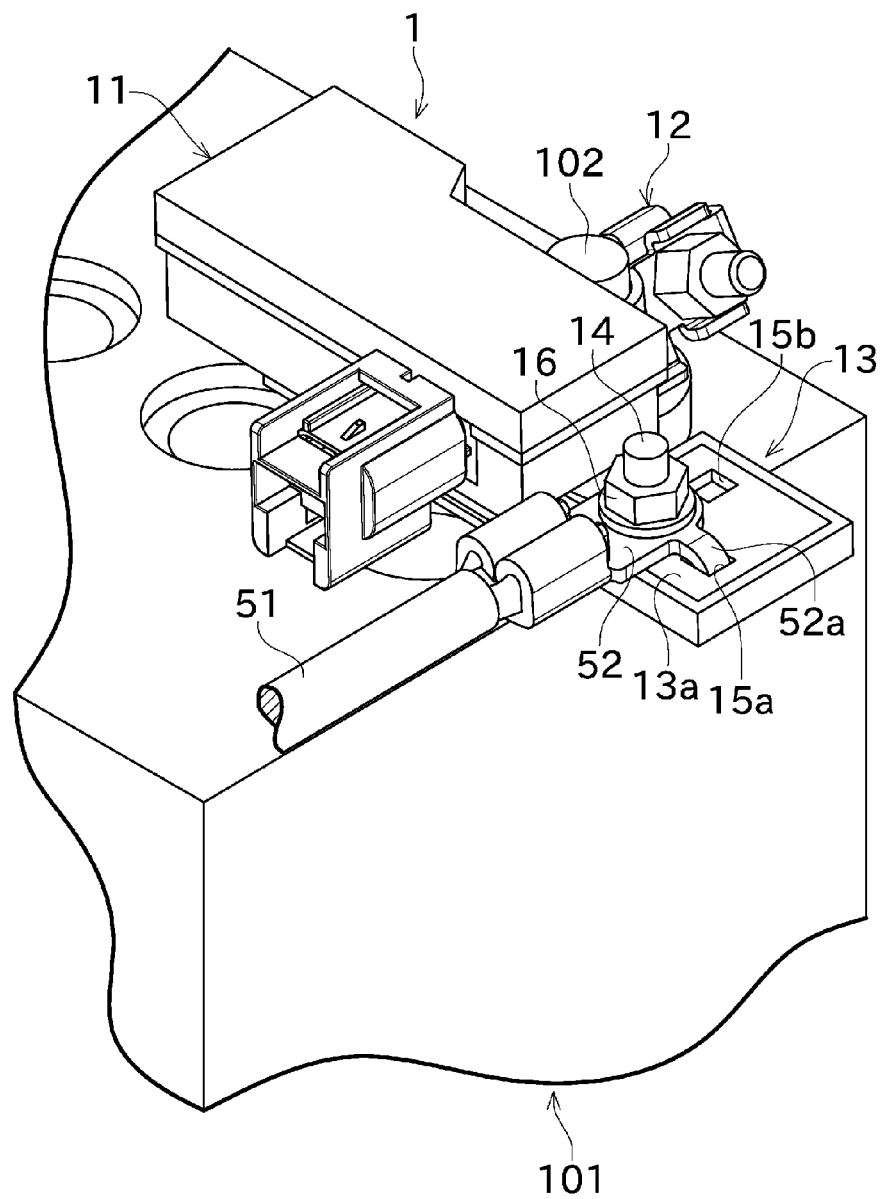
FIG. 1 is a perspective view showing an overall configuration of a battery condition detection sensor according to a first embodiment of the present invention.

DESCRIPTION OF THE REFERENCE NUMERALS 1 battery condition detection sensor
11 main body
12 battery post terminal
13 shunt resistor
14 stud
15a, 15b insertion hole (insertion recess)
16 nut
51 wire harness
52 connection terminal
52a pawl (protrusion)
101 battery
102 battery post

BEST MODE FOR CARRYING OUT THE INVENTION

Figure 2:
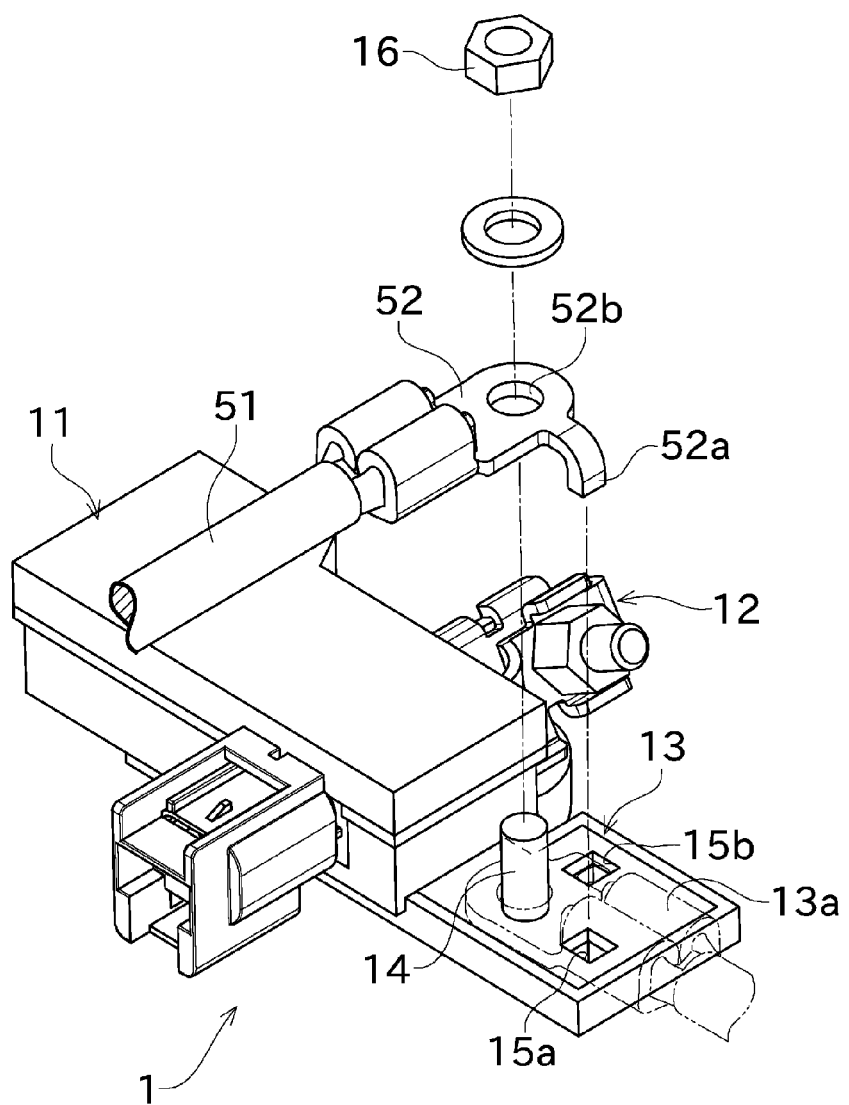
FIG. 2 is an exploded perspective view showing connection of a wire harness to the battery condition detection sensor.

Next, embodiments of the present invention will be described with reference to the drawings. FIG. 1 is a perspective view showing an overall configuration of a battery condition detection sensor 1 according to a first embodiment of the present invention. FIG. 2 is an exploded perspective view showing connection of a wire harness 51 to the battery condition detection sensor 1.

The battery condition detection sensor 1 shown in FIG. 1 is connected to a negative side of a battery 101, and measures a voltage, a current, a temperature, and an internal resistance of the battery 101, to thereby obtain the SOC (state-of-charge), the SOH (state-of-health), and the SOF (state-of-function) of the battery 101. The battery condition detection sensor 1 of this embodiment is used as a sensor for a battery mounted in a vehicle.

The battery condition detection sensor 1 includes a main body 11 in which a sensing unit not illustrated is provided. The battery condition detection sensor 1 also includes a battery post terminal 12 and a shunt resistor 13.

The battery post terminal 12 is formed so as to protrude from the main body 11. The battery post terminal 12 is formed as an electrically conductive member, and mounted to a battery post 102 that is arranged at a negative electrode of the battery 101.

The shunt resistor 13 has a plate shape, and protrudes from the main body 11 in an L-like shape (see FIG. 2, too). Because of such an L-like shape, the shunt resistor 13 has, at a distal end part thereof, a portion (wide portion 13a) having a larger width than that of a base part close to the main body 11. The shunt resistor 13 is connected to the main body 11, and used for the measurement of the current of the battery 101 by the sensing unit.

In this embodiment, a stud 14 is fixed to an upper surface of the shunt resistor 13 in a protruding manner. The stud 14 is arranged at a position on the shunt resistor 13 somewhat closer to the main body 11. The stud 14 is for mounting a metal-made connection terminal 52 fixed to an end portion of the wire harness 51 to the shunt resistor 13 (battery condition detection sensor 1). The stud 14 is fixed to the shunt resistor 13 by press-fitting.

Small insertion holes (insertion recesses) 15a and 15b are formed through the shunt resistor 13 at positions near the stud 14. The insertion holes 15a and 15b are configured to allow a pawl (protruding portion; protrusion) 52a of the connection terminal 52 to be inserted therethrough when the connection terminal 52 of the wire harness 51 is mounted to the stud 14.

The exploded perspective view of FIG. 2 shows an example in which a through hole 52b formed in the connection terminal 52 of the wire harness 51 is inserted in the stud 14 while the pawl 52a formed downward at a side portion of the connection terminal 52 is inserted in the insertion hole 15a. In this state, a nut 16 is screwed on the stud 14, and thereby the wire harness 51 can be electrically connected to the battery condition detection sensor 1.

Here, with the screwing of the nut 16, a force in a rotation direction is applied to the connection terminal 52. However, in this embodiment, since the pawl 52a of the connection terminal 52 is inserted in the insertion hole 15a, rotation of the wire harness 51 at a time of the screwing is restricted by the pawl 52a being brought into contact with an inner wall (rotation-blocking portion) of the insertion hole 15a. Accordingly, the wire harness 51 can be, at a desired position without rotation, connected to the battery condition detection sensor 1. Thus, a good working efficiency in assembling is obtained. Moreover, even when the wire harness 51 vibrates while a vehicle is traveling, the pawl 52a and the insertion hole 15a can block rotation of the wire harness 51, and therefore can prevent the nut 16 from loosening.

In this embodiment, the above-described rotation-blocking function can be implemented only by the shunt resistor 13, without using any special component part. Therefore, rotation can be blocked with a compact and a low-cost configuration. Furthermore, since both the shunt resistor 13 and the connection terminal 52 are made of a metal, a mechanical damage due to fastening does not easily occur.

In this embodiment, a plurality of (two) insertion holes 15a and 15b are formed, and the insertion holes 15a and 15b are arranged at different angles relative to the stud 14 (in this embodiment, the angles are different from each other by 90°). Accordingly, a direction of mounting the wire harness 51 can be changed simply by selecting which of the insertion holes 15a and 15b the pawl 52a of the connection terminal 52 is to be inserted in. For example, in FIG. 2, a situation where the pawl 52a of the connection terminal 52 is inserted in the insertion hole 15b is illustrated with the dot-dash-lines. In this manner, this embodiment achieves a configuration of the battery condition detection sensor 1 that is compatible with a wide range of various peripheral layout designs.

As described above, in this embodiment, the battery condition detection sensor 1 for measuring characteristics of the battery 101 includes the electrically conductive battery post terminal 12 and the shunt resistor 13. The battery post terminal 12 is mounted to the battery post 102 provided in the battery 101. The shunt resistor 13 is electrically connected to the battery post terminal 12. The shunt resistor 13 is configured such that the connection terminal 52 of the wire harness 51 can be fixed thereto. The shunt resistor 13 has the rotation-blocking portion (the inner walls of the insertion holes 15a and 15b) for blocking rotation of the connection terminal 52.

Thus, a function for blocking rotation of the wire harness 51 is exhibited by the shunt resistor 13 itself. Therefore, blocking of rotation of the wire harness 51 can be achieved with a compact and simple configuration, and the working efficiency in assembling and the reliability of connection can be improved.

In the battery condition detection sensor 1 of this embodiment, the plurality of insertion holes 15a and 15b are formed in the shunt resistor 13. The pawl 52a provided at the connection terminal 52 of the wire harness 51 is inserted in the insertion hole 15a (insertion hole 15b), thereby blocking rotation of the connection terminal 52.

Thus, rotation of the wire harness 51 can be surely blocked with an uncomplicated configuration of a combination of the pawl 52a and the insertion holes 15a and 15b.

In the battery condition detection sensor 1 of this embodiment, the plurality of insertion holes 15a and 15b are formed. The orientation of the wire harness 51 can be changed by selecting which of the insertion holes 15a and 15b the pawl 52a of the connection terminal 52 is to be inserted in.

This can provide the battery condition detection sensor 1 that is flexibly compatible with various layouts of peripheral devices.

In the battery condition detection sensor 1 of this embodiment, the shunt resistor 13 has the wide portion 13a, and the insertion holes 15a and 15b are arranged in the wide portion 13a.

This makes it easy to ensure a space for forming the insertion holes 15a and 15b and the like in the shunt resistor 13.

In the battery condition detection sensor 1 of this embodiment, the stud 14 for fixing the connection terminal 52 is fixed to the shunt resistor 13 by press-fitting.

This enables the wire harness 51 to be connected to the battery condition detection sensor 1 with a simple and low-cost configuration. Additionally, since rotation of the connection terminal 52 around the stud 14 can be blocked by the pawl 52a and the insertion holes 15a and 15b, a good working efficiency in assembling is obtained, and loosening of the screwing due to vibrations can be surely prevented.

Next, a second embodiment will be described. FIG. 3 is a perspective view showing a battery condition detection sensor 1x of the second embodiment. In a description of this embodiment, members identical or similar to those of the above-described embodiment are given the same corresponding reference numerals on the drawings, and descriptions thereof may be omitted.

In the battery condition detection sensor 1x according to the second embodiment, the shunt resistor 13 does not have the wide portion 13a of the above-described embodiment, and the insertion holes 15a and 15b are not formed. In this embodiment, rotation of the wire harness 51 is blocked by the pawl 52a of the connection terminal 52 being brought into contact with end surfaces 13x and 13y of the shunt resistor 13. Accordingly, in this embodiment, the end surfaces 13x and 13y of the shunt resistor 13 correspond to the rotation-blocking portion.

The two end surfaces 13x and 13y of the shunt resistor 13 face in directions perpendicular to each other, and are arranged at an equal distance from the stud 14. Therefore, in the same manner as the above-described first embodiment, the direction of mounting the wire harness 51 can be changed simply by selecting which of the two end surfaces 13x and 13y the pawl 52a of the connection terminal 52 is to be in contact with.

As described above, in the battery condition detection sensor 1x of this embodiment, the pawl 52a provided at the connection terminal 52 is brought into contact with an outer edge portion (end surfaces 13x and 13y) of the shunt resistor 13, thereby blocking rotation of the connection terminal 52.

Thus, blocking of rotation of the wire harness 51 can be achieved with a further compact and simple configuration.

In the battery condition detection sensor 1x of this embodiment, the orientation of the wire harness 51 can be changed by selecting a position (the end surface 13x or 13y) where the pawl 52a of the connection terminal 52 is brought into contact with the outer edge portion of the shunt resistor 13.

This can provide the battery condition detection sensor 1x that is flexibly compatible with various layouts of peripheral devices.

While some preferred embodiments of the present invention have been described above, the foregoing configurations may be modified, for example, as follows.

In a modification, the shape of the insertion holes 15a and 15b may be, for example, a recess or an elongated groove, instead of a small through hole. It may also be possible that a cutout portion is formed at the outer edge portion of the shunt resistor 13, so that blocking of rotation of the wire harness 51 is achieved by inserting the pawl 52a into the cutout portion.

In a modification, the number of insertion holes 15a and 15b and the number of end surfaces 13x and 13y may be three or more, instead of two. In this case, an angle of drawing the wire harness 51 can be changed in multiple stages. In a modification, furthermore, the number of insertion holes or end surfaces for blocking rotation by a contact with the pawl 52a may be only one.

The invention claimed is:

1. A battery condition detection sensor for measuring characteristics of a battery, the battery condition detection sensor comprising:
   an electrically conductive battery post terminal configured to be mounted to a battery post provided in the battery; and
   a shunt resistor electrically connected to the electrically conductive battery post terminal,
   wherein
   the shunt resistor is configured such that a connection terminal fixed to a wire harness is fixed thereto,
   the shunt resistor has a rotation-blocking portion for blocking rotation of the connection terminal,
   at least one insertion recess is formed in the shunt resistor,
   a protrusion provided at a side portion the connection terminal is inserted in the at least one insertion recess, thereby blocking rotation of the connection terminal, and
   more than one insertion recesses are formed, and an orientation of the wire harness is changeable by selecting in which of the insertion recesses the protrusion is to be inserted.

2. A battery condition detection sensor for measuring characteristics of a battery, the battery condition detection sensor comprising:
   an electrically conductive battery post terminal configured to be mounted to a battery post provided in the battery; and
   a shunt resistor electrically connected to the electrically conductive battery post terminal,
   wherein
   the shunt resistor is configured such that a connection terminal fixed to a wire harness can be fixed thereto,
   the shunt resistor has a rotation-blocking portion for blocking rotation of the connection terminal,
   at least one insertion recess is formed in the shunt resistor,
   a protrusion provided at the connection terminal is inserted in the at least one insertion recess, thereby blocking rotation of the connection terminal,
   the shunt resistor has a wide portion, and
   the at least one insertion recess is formed in the wide portion.

3. A battery condition detection sensor for measuring characteristics of a battery, the battery condition detection sensor comprising:

an electrically conductive battery post terminal configured to be mounted to a battery post provided in the battery; and a shunt resistor electrically connected to the electrically conductive battery post terminal, wherein the shunt resistor is configured such that a connection terminal fixed to a wire harness is fixed thereto, the shunt resistor has a rotation-blocking portion for blocking rotation of the connection terminal, a protrusion provided at and formed at a side portion of the connection terminal is brought into contact with an outer edge portion of the shunt resistor, thereby blocking rotation of the connection terminal, and an orientation of the wire harness is changeable by selecting a position where the protrusion of the connection terminal is brought into contact with the outer edge portion of the shunt resistor.

4. The battery condition detection sensor for measuring characteristics of the battery, according to claim 1 or claim 3, wherein the battery condition detection sensor further comprises:

a stud for fixing the connection terminal, wherein the stud is fixed to the shunt resistor by press-fitting.

* * * * *

UNITED STATES PATENT AND TRADEMARK OFFICE
CERTIFICATE OF CORRECTION

PATENT NO.         : 8,988,077 B2
APPLICATION NO.    : 13/387735
DATED              : March 24, 2015
INVENTOR(S)        : Ishihara It is certified that error appears in the above-identified patent and that said Letters Patent is hereby corrected as shown below:

On the Title Page
Item (73) delete:
"Furukawa Electric Co., Ltd. (Tokyo, JP)"

insert

-- Furukawa Electric Co., Ltd. (Tokyo, JP) and Furukawa Automotive Systems Inc. (Shiga, JP) --

Signed and Sealed this
Ninth Day of June, 2015

Michelle K. Lee
*Director of the United States Patent and Trademark Office*